United States Patent
Gris et al.

(10) Patent No.: US 6,506,655 B1
(45) Date of Patent: Jan. 14, 2003

(54) BIPOLAR TRANSISTOR MANUFACTURING METHOD

(75) Inventors: Yvon Gris, Tullins (FR); Germaine Troillard, Le Touvet (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/517,241

(22) Filed: Mar. 2, 2000

(30) Foreign Application Priority Data

Mar. 12, 1999 (FR) ............................................ 99 03260

(51) Int. Cl.[7] ............................................ H01L 21/331
(52) U.S. Cl. ...................... 438/309; 438/202; 438/345; 438/348; 438/350; 438/365; 438/366; 438/368; 438/369; 438/491; 438/530; 438/558; 438/564; 257/565
(58) Field of Search ................................ 438/309, 202, 438/345, 348, 350, 365, 366, 368, 369, 491, 530, 558, 564; 257/565

(56) References Cited

U.S. PATENT DOCUMENTS

| 5,235,206 A | | 8/1993 | Desilets et al. | ............. | 257/578 |
|---|---|---|---|---|---|
| 5,880,000 A | * | 3/1999 | Gris | ............. | 438/309 |
| 5,953,600 A | * | 9/1999 | Gris et al. | ............. | 438/200 |
| 5,970,333 A | * | 10/1999 | Gris et al. | ............. | 438/207 |
| 6,001,676 A | * | 12/1999 | Sawada et al. | ............. | 438/202 |
| 6,180,442 B1 | * | 1/2001 | Gris | ............. | 438/202 |

FOREIGN PATENT DOCUMENTS

| EP | 0 746 032 | 12/1996 | ............ H01L/27/06 |
|---|---|---|---|
| EP | 0 843 350 | 5/1998 | ......... H01L/21/331 |

OTHER PUBLICATIONS

French Search Report from French Patent Application 99 03260, filed Mar. 12, 1999.
Barson, F. et al. "Insuring Link–Up In Polysilicon–Base Transistors" IBM Technical Disclosure Bulletin, US, IBM Corp. New York, vol. 26, No. 7A, pp. 3185–3187.

* cited by examiner

Primary Examiner—Caridad Everhart
Assistant Examiner—B. V. Keshavan
(74) Attorney, Agent, or Firm—Wolf, Greenfield & Sacks, P.C.; James H. Morris

(57) ABSTRACT

A method of manufacturing a bipolar transistor in an N-type semiconductor substrate, including the steps of depositing a first base contact polysilicon layer and doping it; depositing a second silicon oxide layer; forming in the first and second layers an opening; annealing to form a third thin oxide layer and harden the second oxide layer; implanting a P-type dopant; depositing a fourth silicon nitride layer; depositing a fifth silicon oxide layer and etching it; anisotropically etching the fifth, fourth, and third layers; performing cleanings during which the fifth layer is reetched and takes a flared profile; depositing a sixth polysilicon layer; and implanting an N-type dopant.

12 Claims, 3 Drawing Sheets

BIPOLAR TRANSISTOR MANUFACTURING METHOD

BACKGROUND OF THE INVENTION

1. Field of the Invention

The present invention relates to the manufacturing of a bipolar transistor in integrated circuits. More specifically the present invention relates to the forming of base and emitter regions of a bipolar transistor in a BICMOS technology.

2. Discussion of the Related Art

Bipolar transistor manufacturing methods that provide delimiting active areas on a semiconductor substrate, depositing a base contact polysilicon coated with a silicon oxide layer, opening a base/emitter area, forming spacers on the opening walls, and depositing an emitter contact polysilicon layer, will be considered. In the context of these methods, the forming of spacers is more specifically considered herein.

In various conventional methods, oxide, nitride, or nitride/polysilicon spacers are used. Each of these methods has advantages and disadvantages. A method in which compound nitride/polysilicon spacers are used will first be described in detail to show their advantages and disadvantages. The advantages and disadvantages of other known spacer types will then briefly be mentioned.

Nitride/Polysilicon Spacers

As illustrated in FIG. 1A, the first steps of a bipolar transistor manufacturing method consist of defining, at the surface of a semiconductor substrate 1, typically made of silicon, active areas delimited by field oxide areas 2. Then, a polysilicon layer 4, intended for forming the base contact, and an insulating layer 5, typically made of silicon oxide, are successively deposited.

At the next steps, illustrated in FIG. 1B, layers 5 and 4 are etched to expose a substantially central portion of the active area. An anneal is then performed, which in particular causes the forming of a silicon oxide layer 6 at the bottom of the window and on the lateral surface of polysilicon layer 4. A dopant of a first conductivity type, for example, type P, typically, boron, is implanted to form base 3i of the bipolar device. A base contact area 3e resulting from a diffusion of the dopants contained in polysilicon layer 4 has also been shown.

At the next steps, illustrated in FIG. 1C, spacers are formed. For this purpose, a silicon nitride layer 7 is conformally deposited. Then, a polysilicon layer is deposited and etched to form spacers 8 such as shown in FIG. 1C.

At the next steps, illustrated in FIG. 1D, silicon nitride layer 7 is removed everywhere it is not protected by spacers 8, and the bottom of the window is cleaned to expose base region 3. Finally, an emitter contact layer 9, typically made of polysilicon, is deposited. Layer 9 then undergoes an implantation of an N-type dopant that diffuses to form an emitter region 10.

A base/emitter junction between an emitter region 10 and a base region 3 has thus been formed, the distance between the base and emitter contacts being defined by compound spacers formed of thermal oxide 6, silicon nitride 7, and polysilicon 8.

FIG. 1D clearly shows the functions that the spacer has to perform and the qualities that it must have.

1) The spacer must ensure good insulation between polysilicon layers 4 and 9. This insulation is essentially ensured by nitride layer 7. However, given the very small thickness of layer 7 and the silicon nitride etch properties, layer 7 is overetched under polysilicon 8, as illustrated in FIG. 1D. This overetching results in various disadvantages: the formed cavity will be poorly filled by polysilicon 9 and it creates a heterogeneity that can be a source of mechanical stress and in any case of poor control of the manufacturing process.

2) The capacitance between base polysilicon region 4 and emitter region 9 must be as small as possible. Indeed, it is generally desired for the bipolar transistor to switch rapidly. This result is not obtained. Indeed, polysilicon 8 is conductive and the silicon nitride is very thin and has a high dielectric constant.

3) The distance between the foot (the area of contact with the substrate) of polysilicon 4 and the foot of polysilicon 9, as well as the surface of the contact between polysilicon 9 and the substrate must be precisely determined and be reproducible. A priori, the polysilicon spacers have a clear-cut shape and straight edges. However, the etching of oxide layer 6 is not always ideal. Indeed, due to the poor wetability between polysilicon and any etch solution, bubbles can form at the bottom of the window, at the level of the spacer angle, which results in a poor removal of layer 6 at this location, as illustrated in FIG. 1D. Similarly, the subsequent washing with deionized water, intended for removing the etch residue and the excess hydrofluoric acid, will not be perfect. Malfunctions of the device may result therefrom.

4) The opening defined by the spacer and into which polysilicon 8 penetrates must preferably be flared enough to ease the subsequent doping of this polysilicon by implantation and to reduce access resistances. This result is obviously not obtained with the spacers of FIG. 1D, the anisotropic etching of the polysilicon being practically vertical.

5) There must exist no differential stress between the spacer and the underlying substrate. This object is properly fulfilled by a nitride/polysilicon spacer.

Silicon Nitride Spacers

It has also been attempted to use nitride spacers. However, significant technological difficulties arise when forming sufficiently thick spacers. These spacers have all the disadvantages discussed at points 1) to 4) relative to nitride/polysilicon spacers. Further, as concerns point 5), they generally generate differential stress.

Silicon Oxide Spacers

Simple silicon oxide spacers have a very rounded upper corner and sides slightly diverging outwards. They are thus preferable as concerns point 4). Also, as concerns point 2), these spacers are satisfactory since they can be relatively thick and the dielectric constant of SiO2 is much smaller than that of Si3N4.

As concerns points 1) and 3), these spacers have significant disadvantages.

Besides, upon etching of the spacers, silicon oxide based polymers form at the exposed surface of the substrate. These polymers will be difficult to eliminate. Indeed, it is not possible to wash them off by means of hydrofluoric acid, since there would then be a risk to overetch the spacers, also made of silicon oxide, and thus to increase the opening width, which is not desirable.

Especially as concerns point 5), another disadvantage of silicon oxide spacers is the generation of thermal expansion stress between the oxide and the underlying silicon. This disadvantage is in particular underlined in patent application EP-A-0746032 assigned to Matsuhita Electronics Corporation. This document, which advocates the use of oxide or nitride/oxide spacers for MOS transistors of a BICMOS structure, indicates that thermal stress problems forbid the use of such spacers for bipolar transistors and advocates the use of compound nitride/polysilicon spacers for such transistors, which greatly complicates the manufacturing method.

SUMMARY OF THE INVENTION

An object of the present invention is to provide a novel method of manufacturing bipolar transistors that overcomes one or several of the disadvantages of the various known methods.

Another object of the present invention is to provide such a method that reduces the resistance of the base-emitter junction.

Another object of the present invention is to provide such a method that is simple to implement, in particular in a BICMOS technology.

To achieve these and other objects, the present invention provides a method of manufacturing a bipolar transistor in a semiconductor substrate of a first conductivity type, including the steps of depositing a first base contact polysilicon layer and doping it; depositing a second silicon oxide layer; forming in the first and second layers an opening; annealing to form a third thin oxide layer and harden the second oxide layer; implanting a dopant of the second conductivity type; depositing a fourth silicon nitride layer; depositing a fifth silicon oxide layer and etching it; anisotropically etching the fifth, fourth, and third layers; performing cleanings during which the fifth layer is reetched and takes a flared profile; depositing a sixth polysilicon layer; and implanting a dopant of the first conductivity type.

According to an embodiment of the present invention, the step of doping the first polysilicon layer includes performing a low-energy implantation to initially concentrate the dopant atoms in the upper portion of the first polysilicon layer.

According to an embodiment of the present invention, the cleanings include a cleaning an acid matter, a cleaning under oxygen plasma and a wet cleaning.

According to an embodiment of the present invention, the third thin oxide layer has a thickness on the order of 5 nm.

According to an embodiment of the present invention, the fourth silicon nitride layer has a thickness on the order of 30 nm.

According to an embodiment of the present invention, the fifth silicon oxide layer has a thickness on the order of 150 nm.

The foregoing objects, features and advantages of the present invention, will be discussed in detail in the following non-limiting description of specific embodiments in connection with the accompanying drawings.

DETAILED DESCRIPTION

For clarity, the same elements have been designated by the same references in the different drawings. Further, as usual in the representation of integrated circuits, the various drawings are not to scale.

Figure 1A:
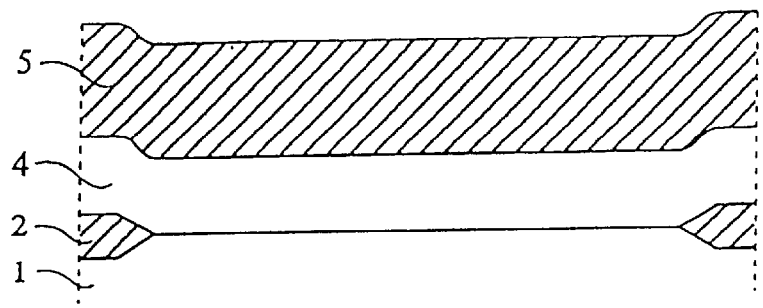
FIGS. 1A to 1D show in cross-section different steps of a conventional method of forming base and emitter regions of a bipolar transistor.
Figure 1B:
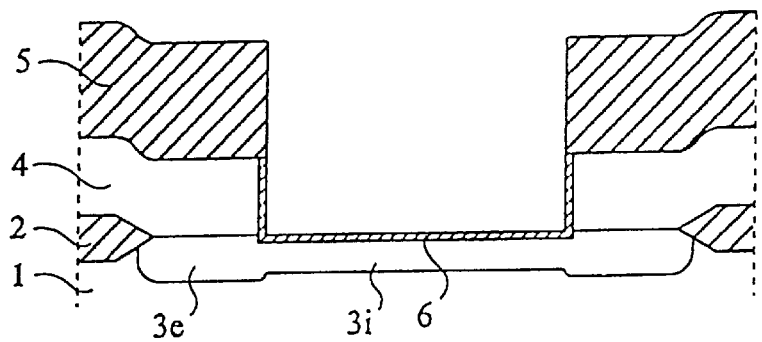
Figure 1C:
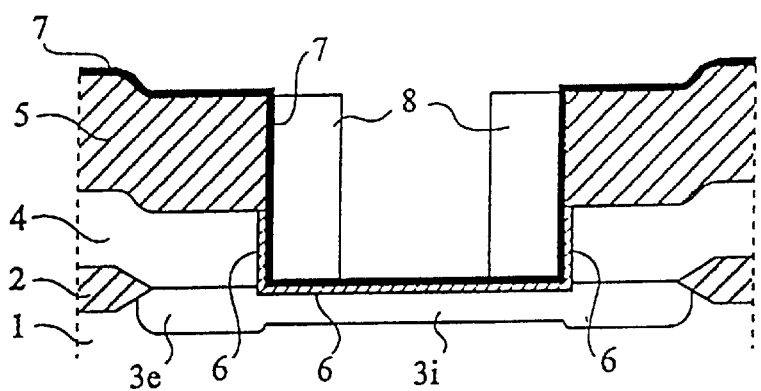
Figure 1D:
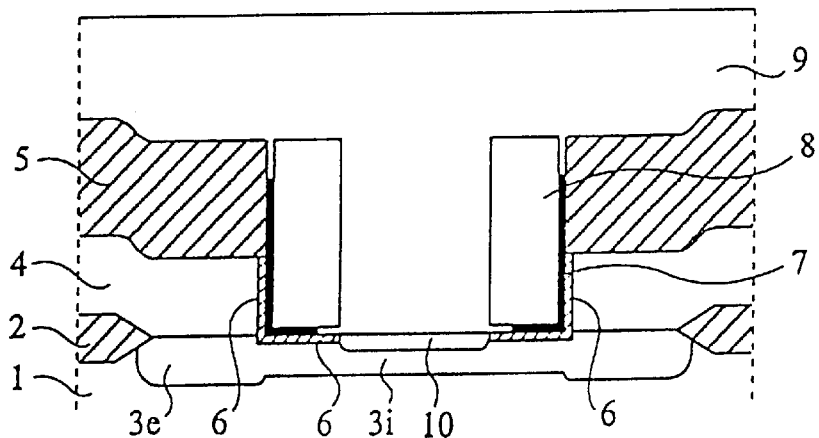
Figure 2A:
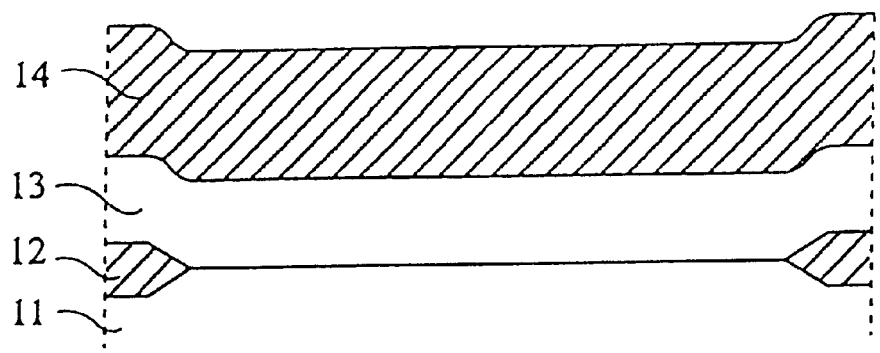
FIGS. 2A to 2F illustrate a method of forming base and emitter regions of a bipolar transistor according to the present invention.

As illustrated in FIG. 2A, the initial steps include delimiting an active area in a semiconductor substrate 11, for example, made of single-crystal silicon, by insulating areas 12. The substrate can be a uniformly doped silicon wafer, or an area epitaxied and/or specifically doped by diffusion/implantation formed on or in a massive substrate. Insulating areas 12 can be specifically oxidized substrate regions (LOCOS method), isolating trenches filled with silicon oxide (ROX method), or the like. After defining the active areas, a polysilicon layer 13 for forming the base contacts is deposited. Layer 13 for example has a 200-nm thickness. A dopant of a first conductivity type, for example, P-type, is then implanted at the surface of conductor 13. This is done by implanting boron at low energy, for example, 15 keV, and at a dose of $5.10^{15}$ at./cm$^2$ so that the implanted dopant atoms be distant from the substrate and do not diffuse therein as soon as the first anneal. The structure thus formed is covered with an insulating layer 14, for example, a silicon oxide layer of a 300-nm thickness. Layer 14 may be formed by any conventional technique, such as a chemical phase vapor deposition.

Figure 2B:
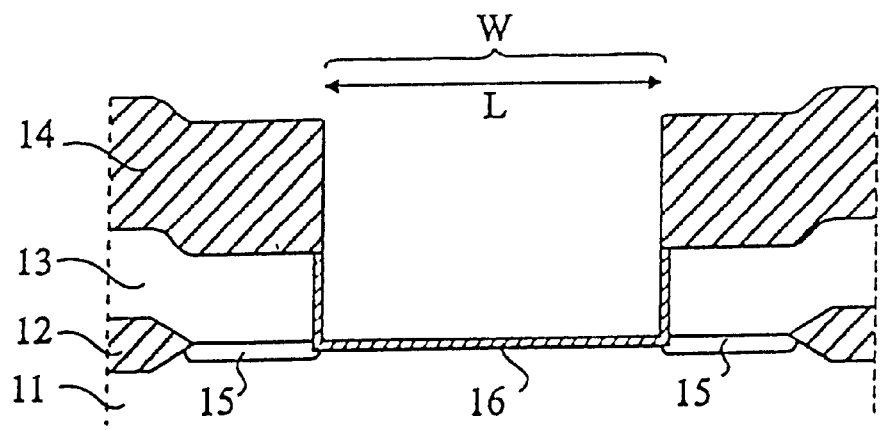

At the next steps, illustrated in FIG. 2B, layers 13 and 14 are etched to form a window W of width L. A thermal anneal is then performed, whereby a thermal oxide 16 grows at the surface of substrate 11 at the bottom of window W and on the exposed side of polysilicon layer 13. This oxide is very thin and has, for example, a thickness on the order of 5 nm.

This anneal advantageously causes a hardening of insulating layer 14 and a diffusion of a P-type extrinsic base region 15.

Figure 2C:
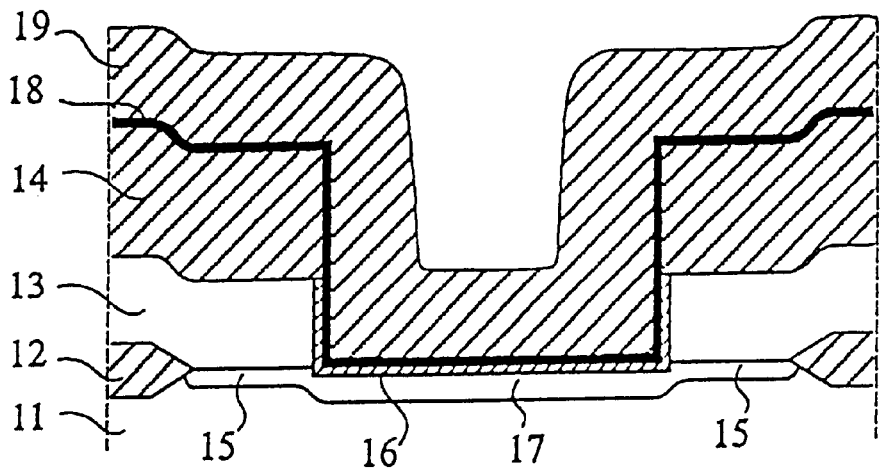

At the next steps, illustrated in FIG. 2C, a base region 17 is formed by implantation through thin oxide 16. Base region 17 is of same conductivity type as layer 13. A silicon nitride layer 18 is then conformally deposited. Layer 18 has for example a thickness on the order of 30 nm. A silicon oxide layer 19 intended for the spacer forming and having for example a thickness on the order of 150 nm is then conformally deposited.

Figure 2D:
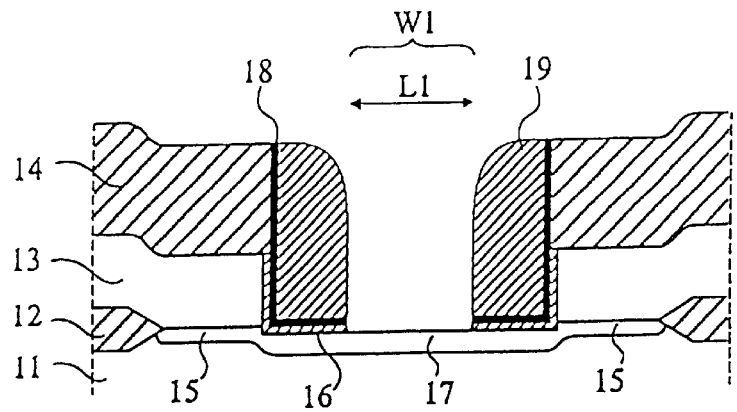

At the next steps, illustrated in FIG. 2D, oxide layer 19 is anisotropically etched to leave spacers, after which nitride layer 18 and thermal oxide layer 16 are also anisotropically etched. These etchings are performed successively in the same etch equipment and stop on the underlying silicon surface over a width L1, at the bottom of a window W1. Thermal oxide layer 16 being extremely thin, it can be assumed that the last etching is the etching of nitride layer 18, and this is particularly favorable, since this etching does not tend to create polymers depositing on the silicon. The polymers that have formed must then, however, be eliminated.

Figure 2E:
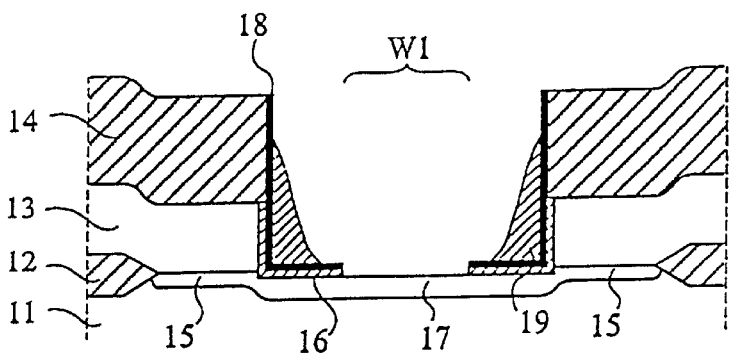

At the next step, illustrated in FIG. 2E, cleanings are performed, preferably in three steps. First, a wet cleaning by acid matters in the presence of oxygenated water. Second, a cleaning under oxygen plasma to crack the polymer molecules. Third, a cleaning in the presence of hydrofluoric acid to eliminate the particles resulting from the preceding cleaning.

These cleanings advantageously have the effect of partially reetching the spacers formed from layer 19 on the walls of window W1. The reetching of layer 19 is substantially performed over a 100-nm thickness. This results in a flared profile such as shown in FIG. 2E in which layer 19 is substantially removed from the upper portion of the vertical walls of openings W, that is, substantially at the level of insulating layer 14, and maintained in the lower portion of opening W, that is, substantially facing the vertical walls of base contact layer 13. It should be noted that, during these cleanings, the upper surface of oxide layer 14 is little affected, this layer having undergone a hardening operation. Roughly, it is six times less etched than oxide layer 19. This is a significant advantage of the method according to the present invention.

Figure 2F:
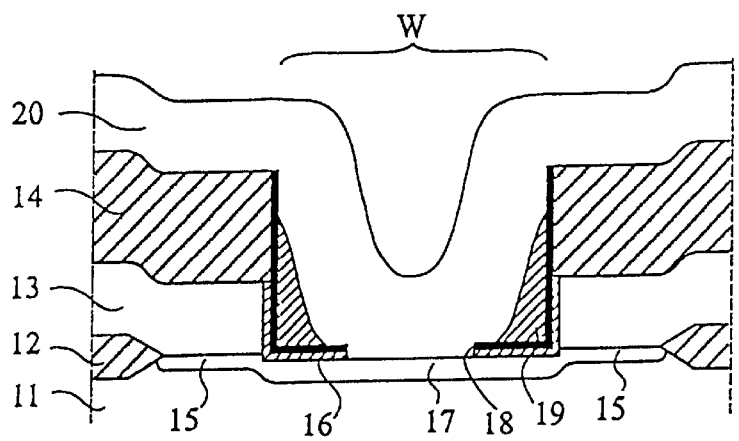

At the next steps, illustrated in FIG. 2F, an emitter contact polysilicon layer 20 is conformally deposited. Layer 20 for example has a 250-nm thickness. A dopant of a second conductivity type is then implanted at the surface of layer 20. In the considered case, this N-type implantation is performed by arsenic at a dose of $10^{16}$ at./cm$^2$ under a 80-keV energy. It should be noted that layer 20 has in window W a substantially constant width.

Referring back to previously discussed features 1) to 5) that a spacer must preferably fulfill, it will be seen that the spacer according to the present invention has many advantages as compared to the compound nitride/polysilicon spacer.

1) The insulation between the two polysilicon regions 13 and 20 is ensured by, in addition to very thin thermal oxide layer 16, the silicon nitride thickness, which is affected by none of the steps of the method and which is not submitted to an overetching, and by the remaining thickness of oxide spacers 19.

2) For the same reason, the capacitance between the two polysilicon regions is reduced.

3) The dimensions are obtained precisely since they result from the step of etching nitride 18 illustrated in FIG. 2D.

4) As can be seen from FIG. 2F, the opening defined by the spacer is flared, and polysilicon layer 20 has a substantially constant thickness above the opening. It especially includes a relatively deep basin, which favors obtaining a regular doping of the polysilicon by implantation.

5) Finally, the problem of residual stress is solved by the reetching of the oxide spacer, which changes from the conventional shape illustrated in FIG. 2D to the flared shape according to the present invention illustrated in FIGS. 2E and 2F.

Further, the manufacturing method according to the present invention is easy to implement by conventional techniques and in particular, since silicon oxide has a good wetability with respect to currently used cleaning products, the cleanings of the contact surfaces are eased.

Of course, the present invention is likely to have various alterations, modifications, and improvements which will readily occur to those skilled in the art, as concerns its implementation and its applications. In particular, the present invention has been described in the specific case of the forming of a bipolar NPN-type device as an example only, and all that has been stated also applies to the forming of an PNP-type device, provided that the conductivity types of the implanted dopants are appropriately modified.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and he equivalents thereto.

What is claimed is:

1. A method of manufacturing a bipolar transistor in a semiconductor substrate of a first conductivity type, including the steps of depositing a first layer of polysilicon and doping the first layer with a dopant of the second conductivity type; depositing a second layer of silicon oxide; forming in the first layer and second layer an opening, and further including the steps of:

annealing the substrate, first layer and second layer to form a third layer of oxide and to harden the second layer;

implanting a dopant of the second conductivity type in the substrate;

depositing a fourth layer of silicon nitride;

depositing a fifth layer of silicon oxide and etching the fifth layer;

anisotropically etching the fifth layer, fourth layer, and third layer;

performing cleanings during which the fifth layer is reetched and takes a flared profile;

depositing a sixth layer of polysilicon; and implanting a dopant of the first conductivity type in the sixth layer.

2. The method of claim 1, wherein the step of doping the first layer includes performing a low-energy implantation to initially concentrate the dopant atoms in the upper portion of the first layer.

3. The method of claim 1, wherein the cleanings include a cleaning in an acid bath, a cleaning under oxygen plasma and a wet cleaning.

4. The method of claim 1, wherein the third layer has a thickness of about 5 nm.

5. The method of claim 1, wherein the fourth layer has a thickness of about 30 nm.

6. The method of claim 1, wherein the fifth layer has a thickness of about 150 nm.

7. A method of manufacturing a bipolar transistor in a semiconductor substrate of a first conductivity type, comprising:

depositing a first layer of polysilicon;

doping the first layer with a dopant of the second conductivity type;

depositing a second layer of silicon oxide;

forming in the first layer and second layer an opening;

annealing the substrate, first layer and second layer to form a third layer of oxide and to harden the second layer;

implanting a dopant of the second conductivity type in the substrate;

depositing a fourth layer of silicon nitride;

depositing a fifth layer of silicon oxide;

anisotropically etching the fifth layer, fourth layer, and third layer;

performing cleanings during which the fifth layer is reetched and takes a flared profile;

depositing a sixth layer of polysilicon; and implanting a dopant of the first conductivity type in the sixth layer.

8. The method of claim 7, wherein the step of doping the first layer includes performing a low-energy implantation to initially concentrate the dopant atoms in the upper portion of the first layer.

9. The method of claim 7, wherein the third layer has a thickness of about 5 nm.

10. The method of claim 7, wherein the fourth layer has a thickness of about 30 nm.

11. The method of claim 7, wherein the fifth layer has a thickness of about 150 nm.

12. The method of claim 7, wherein the cleanings include a cleaning in an acid bath, a cleaning under oxygen plasma and a wet cleaning.

* * * * *